(12) United States Patent
Buta

(10) Patent No.: US 8,765,053 B2
(45) Date of Patent: Jul. 1, 2014

(54) SN BASED ALLOYS WITH FINE COMPOUND INCLUSIONS FOR NB$_3$SN SUPERCONDUCTING WIRES

(75) Inventor: Florin Buta, Les Acacias (CH)

(73) Assignee: Bruker BioSpin AG, Faellanden (CH)

( * ) Notice: Subject to any disclaimer, the term of this patent is extended or adjusted under 35 U.S.C. 154(b) by 426 days.

(21) Appl. No.: 12/656,347

(22) Filed: Jan. 27, 2010

(65) Prior Publication Data
US 2010/0255998 A1   Oct. 7, 2010

(30) Foreign Application Priority Data

Apr. 1, 2009   (EP) .................................... 09157054

(51) Int. Cl.
*C22C 13/00* (2006.01)
*C22C 1/00* (2006.01)

(52) U.S. Cl.
CPC . *C22C 1/00* (2013.01); *C22C 13/00* (2013.01); *Y10S 420/901* (2013.01)
USPC ........... 420/557; 505/124; 505/431; 420/901; 75/331

(58) Field of Classification Search
CPC ................................. C22C 1/00; C22C 13/00
USPC .............. 505/124, 431; 420/557, 901; 75/331
See application file for complete search history.

(56) References Cited

U.S. PATENT DOCUMENTS

| | | | |
|---|---|---|---|
| 4,341,572 A | 7/1982 | Tachikawa | |
| 4,385,942 A | 5/1983 | Tachikawa | |
| 4,419,145 A | 12/1983 | Tachikawa | |
| 4,435,228 A | 3/1984 | Tachikawa | |
| 4,665,611 A | 5/1987 | Sadakata | |
| 4,767,470 A | 8/1988 | Tachikawa | |
| 4,776,899 A | 10/1988 | Murase | |

(Continued)

FOREIGN PATENT DOCUMENTS

| | | |
|---|---|---|
| EP | 1 750 287 | 2/2007 |
| EP | 1 796 109 | 6/2007 |

(Continued)

OTHER PUBLICATIONS

Suenaga, M. et al., "Superconducting critical temperatures, critical magnetic fields, lattice parameters, and chemical compositions of "bulk" pure and alloyed Nb$_3$Sn produced by the bronze process", J.Appl.Phys.59(3), Feb. 1, 1986.

(Continued)

*Primary Examiner* — Paul Wartalowicz
(74) *Attorney, Agent, or Firm* — Paul Vincent

(57) ABSTRACT

A method for producing a Sn based alloy (15) comprising a metal matrix of a metal matrix material, wherein the metal matrix material comprises Sn, and inclusions of a compound material, further referred to as compound inclusions, wherein the compound material contains one element or a combination of elements of the group Ti, V, Zr, Hf, further referred to as dopant, and one or a plurality of other elements, in particular Sn, Cu and/or Nb. Particles of the metal matrix material, further referred to as matrix particles, are mixed with particles of the compound material, further referred to as compound particles, and the matrix particles and the compound particles are compacted during and/or after their mixing. A Sn based alloy containing finer compound inclusion of a dopant can be prepared, in order to produce Nb$_3$Sn superconductor material with a superior current carrying capacity.

10 Claims, 2 Drawing Sheets

(56) References Cited

U.S. PATENT DOCUMENTS

| | | |
|---|---|---|
| 6,436,554 B2 | 8/2002 | Kubo |
| 6,548,187 B2 | 4/2003 | Nagai |
| 6,981,309 B2 | 1/2006 | Hong |
| 7,459,031 B2 | 12/2008 | Miyazaki |
| 2002/0153119 A1* | 10/2002 | Nagai et al. .................. 164/47 |
| 2005/0163646 A1 | 7/2005 | Li et al. |

FOREIGN PATENT DOCUMENTS

| | | |
|---|---|---|
| GB | 1 379 261 | 1/1975 |
| GB | 1 472 939 | 5/1977 |
| JP | 05325679 | 12/1993 |

OTHER PUBLICATIONS

E. Gregory, B.A. Zeitlin et al. "Attempts to reduce A.C. Losses in high current density internal-tin $Nb_3Sn$", International Cryogenic Materials Conference—ICMC, vol. 50, edited by U. Balachandran, 2004.

Robert Zauter et al., "Spray-Formed High-Tin Bronze-A Homogeneous Pre-Material for $Nb_3Sn$-Based Superconductor Wire", IEEE Transactions on Applied Superconductivity, vol. 17, No. 2, Jun. 2007.

* cited by examiner

SN BASED ALLOYS WITH FINE COMPOUND INCLUSIONS FOR NB$_3$SN SUPERCONDUCTING WIRES

This application claims Paris Convention priority of EP 09 157 054.9 filed Apr. 1, 2009 the complete disclosure of which is hereby incorporated by reference.

BACKGROUND OF THE INVENTION

The invention relates to a method for producing a Sn based alloy comprising a metal matrix of a metal matrix material, wherein the metal matrix material comprises Sn, and inclusions of a compound material, further referred to as compound inclusions, wherein the compound material contains one element or a combination of elements of the group Ti, V, Zr, Hf, further referred to as dopant, and one or a plurality of other elements, in particular Sn, Cu and/or Nb. Such a method is, for example, known from U.S. Pat. No. 6,548,187 B2, see Ref. [11].

More specifically, this invention relates to the fabrication of Nb$_3$Sn superconductors used to wind magnet coils capable of generating high magnetic fields. Such magnets are used, for example, in nuclear magnetic resonance, particle accelerators and colliders, nuclear fusion devices, and in research of magnetic and electronic properties of materials.

Nb$_3$Sn superconducting wires are produced by variants of one of three main methods: the bronze process, the internal Sn process or the powder in tube (PIT) process. In all these processes, the brittle Nb$_3$Sn superconducting phase is formed by reacting essentially Nb and Sn in the presence of Cu at 600-750° C., for a suitable amount of time. Nb and Sn are present in deformable form in the unreacted state of the wire so that a wire can be manufactured by metallurgical deformation processes like extrusion and wire drawing.

The principal distinction between these processes comes from the way in which the Sn (and Cu) are present in the unreacted ductile wire.

In bronze route wires, the Sn is alloyed with Cu, whereas in powder in tube processed wires a mixture of NbSn$_2$ and Sn powders is the Sn source.

In wires fabricated by the internal Sn process, a pure Sn or a Sn alloy core is surrounded by an assembly of Cu and Nb. In both cases, the Nb is not in direct contact with the Sn, but a Cu layer separates them either as matrix for a multitude of Nb filaments as it is the case for the rod type or as a continuous layer between the Sn core and a Nb tube in the case of the tube type internal Sn wires. A number of subelements as described above are contained in the superconducting wire, encompassed by a Cu matrix.

It is well known that adding certain chemical elements to Nb$_3$Sn leads to an enhancement of the critical current density at high magnetic fields [1]. Among these dopant elements are Ti, Ta, Mo, V, Hf, Zr, Ga, In and Ge. To be introduced in the Nb$_3$Sn filaments they are usually alloyed with one of the constituents of the wire. During the reaction heat treatment they diffuse from their source into the growing Nb$_3$Sn layer. When the composition of these dopant elements in their source wire-constituent is properly chosen, at the end of the reaction heat treatment the formed Nb$_3$Sn material will have the optimal concentration, which leads to the highest critical current density in the wire.

In the particular case of Ti, for example, several methods are currently in use or have been attempted in the past. One of the first techniques used was to lightly alloy the Nb with Ti and use this alloy for the filament material [2-4], the principal disadvantage being the increased cost of the filament material. For bronze route wires the additional elements that enhance the upper critical field were also alloyed with the bronze (to form a Cu—Sn—X alloy, where X is one of the aforementioned elements) [2, 5, 6]. Films or sheets of the additional elements on the surface of the Nb filaments have also been proposed [7] but this makes the manufacturing more delicate and expensive.

In the case of internal Sn wires, Cu—X alloys (where X is one of the elements mentioned above) have also been used instead of the pure Cu that separates the Nb alloy filaments/tubes from each other and/or the Sn core [4, 8]. Ti bearing alloy rods (usually Nb—Ti) can be inserted either in the center of each filament for rod type internal Sn wires [9] or in the wall of the tube for tube type wires before extruding them to form the precursor material. Alternatively, for rod type wires, Ti bearing alloy rods can be stacked with the Nb filament rods in during the assembly of the billet for the production of the precursor [10].

For most of the dopant elements, one of the most convenient ways is to alloy them with the Sn [3, 4, 11]. In certain cases this has the additional advantage that the Sn alloyed with these elements becomes harder, making it more compatible with the rest of the precursor materials from the point of view of mechanical deformation to manufacture the wire.

Cast Sn—Ti alloys are currently used, but in most cases these mold cast alloys have hard precipitates that are relatively large in size (25-100 µm) and interfere with the Nb filaments/tubes of the wire when the diameter of the Sn alloy cores becomes comparable with the size of the precipitates. This interference causes a distortion and even cutting of the filaments or tubes [12], which has a negative influence on the current carrying capability of the final Nb$_3$Sn superconducting wire. It can also cause, during the reaction heat treatment to form Nb$_3$Sn, a leak of the Sn in the Cu that encompasses the subelements of the wire, which has a negative influence on the ability of this Cu to help in removing electrical and/or thermal disturbances in the wire.

In the process of preparing cast Sn based alloys, a homogeneous melt of Sn containing the dopant(s) is first prepared by dissolving the dopant(s) in the liquid Sn at a suitable temperature. Subsequently the melt is cast in a mold to form a solid billet. Because of the particular equilibrium between Sn and the dopant element(s), compound precipitates containing Sn and doping element(s) form during the cooling of the liquid, before the solidification of the Sn Nagai et al. have proposed to cast the melt in a Cu mold in order to accelerate the cooling of the melt, thus obtaining a Sn based alloy with finer Sn—Ti compound precipitates [11]. However, the cooling rates for larger material quantities that need to be prepared for practical applications are severely limited in this approach.

The situation is similar for the Sn—Hf, Sn—V and Sn—Zr systems, with large liquidus temperature and low solidus temperature at the compositions of interest (up to 10 atomic % dopant), which leads to difficulties in preparing alloys with small precipitate size.

It is also known to produce Ti-based alloys with a Sn content of 2-12 weight % from elemental Ti and elemental Sn powders, see [16].

A way of preparing solid metal from a melt at fast cooling rates is spray forming, also known as Osprey process. In such a process, as described by several patents of Osprey Metals Ltd. (United Kingdom) [13, 14], a stream of molten metal is broken by a high pressure gas atomizer into fine droplets that form a directed jet. The spray of droplets is collected by a moving or rotating table onto which the material accumulates to form a dense, solid body that can be later deformed or machined to the desired shape and dimensions.

It is the object of the invention to introduce a method for preparing a Sn based alloy containing finer compound inclusion with a dopant in order to produce $Nb_3Sn$ superconductor material with a superior current carrying capacity.

SUMMARY OF THE INVENTION

This object is achieved, in accordance with the invention, by a method as introduced in the beginning, characterized in that particles of the metal matrix material, further referred to as matrix particles, are mixed with particles of the compound material, further referred to as compound particles, and that the matrix particles and the compound particles are compacted during and/or after their mixing.

According to the present invention, the dopant is introduced into the Sn based alloy not by dissolving it within liquid matrix material, but by mixing particles of the matrix material with particles of the compound material. From the inventive mixing process results an agglomerate of mixed particles, in which the original compound particles and the original matrix particles keep their individuality. Touching matrix and compound particles build up phase interfaces within the agglomerate of mixed particles. During mixing and compaction, the matrix particles are typically deformed, but at least the compound particles do not change their volume or mass and, in particular, are not dissolved.

In this way, the solubility of the compound material (and the dopant in particular) within the liquid matrix material does not affect the quality of the obtained Sn based alloy. More specifically, by mixing separately obtained matrix particles and compound particles, the size of the matrix particles and the compound particles in the agglomerate of mixed particles can be chosen independently. In particular, the size of the compound particles may be chosen as small as needed in order to avoid the distortion or breakage of the filamentary structure of the conductor during wire drawing.

In agreement with the particulate nature of the matrix particles and the compound particles, the mixing is not done chemically in a solution, but mechanically (in other words by a relative movement of the different particles) as long as the matrix particles and compound particles are still moving with respect to each other. During or after mixing of the matrix particles and the compound particles, the mixed particle agglomerate is compacted, in order to obtain a dense Sn based alloy material. This compaction is predominantly mechanical, typically by exerting force onto the surface of the agglomerate of mixed particles. During their compaction, the matrix particles will sinter to each other, typically under the combined action of mechanical pressure and temperature.

Note that in accordance with the invention, matrix or compound particles to be mixed may be liquid or solid. In case of liquid matrix and/or compound particles to be mixed, the liquid particles are cooled and thus solidified upon building the agglomerate in order to retain the individuality of the particles, in accordance with the invention. More generally, in accordance with the invention, the temperature of the agglomerate of mixed matrix and compound particles is kept low enough to avoid interdiffusion of compound material and matrix material in the agglomerate of mixed particles. More specifically, the temperature of the agglomerate of mixed particles is kept below the melting point of Sn, in particular during compaction.

In a preferred variant of the inventive method, the mixing and the compaction of the matrix particles and the compound particles is done simultaneously by spraying liquid metal matrix material in a directed jet of droplets onto a target and at the same time spraying a directed jet of solid compound particles onto the target. In this variant, the mixing of particles is achieved by directing two jets onto the same target, with one jet delivering liquid matrix particles and one jet delivering solid compound particles to the target, with the two jets overlapping at least at the target surface. The two jets may originate from the same source or from spatially separated sources, in accordance with this variant. The mixing "in the flight" of the particles avoids the building of particle clusters, in particular clusters of compound particles, and thus results in a very uniform distribution of the compound particles in the agglomerate of mixed particles. The kinetic energy of the particles hitting the target is transformed in deformation energy, so a good compaction of the resulting Sn based alloy can be obtained without further measures. Note that it is also possible to spray both the metal matrix material and the compound particles by a single high pressure gas atomizer fed with molten matrix metal and solid compound particles. In such a case it may appear that only one directed jet is present. The mixing will start at an earlier stage then, from the moment the spray is generated.

In a preferred further development of the above variant, for spraying the liquid metal matrix material, the metal matrix material is melted and heated to a temperature of not more than 600° C. This simplifies the cooling of the matrix material droplets on the target. Note that since the dopant is in the compound particles, there is no need for excessive heating of the matrix material for solubility reasons.

In another preferred further development of the above variant, the target is a rotating table. This helps in obtaining a uniform, cylindrically shaped Sn based alloy.

Also preferred is a further development of the above variant, wherein the target is cooled. This helps to remove heat from the deposited agglomerate and so reduce unwanted flow of solidifying droplets of metal matrix as well as diffusion processes.

In a particularly preferred variant of the inventive method, solid matrix particles are first mixed with solid compound particles and then the mixture of the solid matrix particles and the solid compound particles is compacted by pressing at a temperature below the melting temperature of Sn. This procedure is particularly simple, with no need to handle molten metal. The compound particle size within the resulting Sn based alloy is directly controlled by the size of the solid compound particles. Since the temperature is kept below the melting temperature of Sn, diffusion and in particular grain growth of compound particles will not occur (or only to a negligible extent). The pressing (typically isostatic or uniaxial pressing) is separate and independent from the mixing process (most conveniently by bringing the matrix and compound particles together and shaking them).

In a further development of the above variant, the compaction is done at a temperature of between 10° C. and 231° C. and with a pressure of between 0.1 MPa and 10 GPa. These parameter ranges are preferred in practice.

In another particularly preferred variant of the inventive method, the matrix particles have a maximum diameter of 200 µm or less, in particular 100 µm or less. Also preferred is a variant wherein the compound particles have a maximum diameter of 10 µm or less, in particular 5 µm or less. With these parameter ranges, good quality superconducting wires can be obtained, in particular with a low risk of non-uniformity in the superconducting paths of drawn wires.

Also within the scope of the present invention is a Sn based alloy, in particular wherein said Sn based alloy is obtained by an inventive method as described above, said Sn based alloy comprising a metal matrix of a metal matrix material, wherein the metal matrix material comprises Sn, and inclusions of a compound material, further referred to as compound inclusions, wherein the compound material contains one element or a combination of elements of the group Ti, V, Zr, Hf, further referred to as dopant, and one or a plurality of other elements, in particular Sn, Cu and/or Nb, wherein the compound inclusions are uniformly distributed within the metal matrix, characterized in that the Sn based alloy is obtained by mixing and compacting particles of the metal matrix material, further referred to as matrix particles, and particles of the compound material, further referred to as compound particles. With this type of Sn based alloy, the size of compound inclusions can be chosen independently from the solubility of the compound material (in particular of included dopants) in the matrix material in liquid phase.

In a particularly preferred embodiment of the inventive Sn based alloy, the compound inclusions have a diameter of 10 µm or less, in particular 5 µm or less. These sizes of compound inclusions can easily be obtained within the inventive Sn based alloy, making it well-suited for manufacturing high quality superconducting $Nb_3Sn$ material, in particular in drawn wires.

Particularly preferred is an embodiment wherein the Sn based alloy has a total content of 0.5 to 10 atomic % of elements of the group Ti, V, Hf, Zr, Nb. Further preferred is an embodiment wherein the Sn based alloy has a content of 0.1 to 20 atomic % of Cu. These concentrations have shown to result in the highest current carrying capacities in $Nb_3Sn$ superconducting wires manufactured from the Sn based alloy.

Further preferred is an embodiment wherein the Sn based alloy has a total content of 0 to 5 atomic % of elements not comprised in the group Sn, Ti, V, Hf, Zr, Cu, Nb. Due to a low impurity and defect density level, this allows the manufacturing of $Nb_3Sn$ superconducting wires with a high current carrying capacity.

Also within the scope of the present invention is the use of an inventive Sn based alloy as described above for producing a $Nb_3Sn$ superconductor wire, in particular by an internal tin diffusion process. The obtained superconducting wire has a superior quality as compared to superconducting wires made from Sn based alloys with compound inclusions precipitated from a matrix-dopant solution.

In a preferred variant of the inventive use, the $Nb_3Sn$ superconductor wire is assembled from precursors containing a multitude of Nb or Nb alloy rods in a Cu matrix in close proximity of one or more rods of the inventive Sn based alloy as described above. Since the Sn based alloy can benefit from a fine compound inclusion distribution, stretching the Sn based alloy rods during wire drawing has a low risk of deteriorating the current carrying capacity.

Further preferred is a use variant wherein the $Nb_3Sn$ superconductor wire is assembled from precursors containing Nb or Nb alloy tubes, wherein the inner space of the Nb or Nb alloy tubes is at least partially filled with the inventive Sn based as described above, and wherein a layer of Cu separates the Nb or Nb alloy from the Sn based alloy. Again, stretching the inner space of the Nb (alloy) tubes during wire drawing has a low risk of deteriorating the current carrying capacity.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DESCRIPTION OF THE PREFERRED EMBODIMENT

Figure 1:
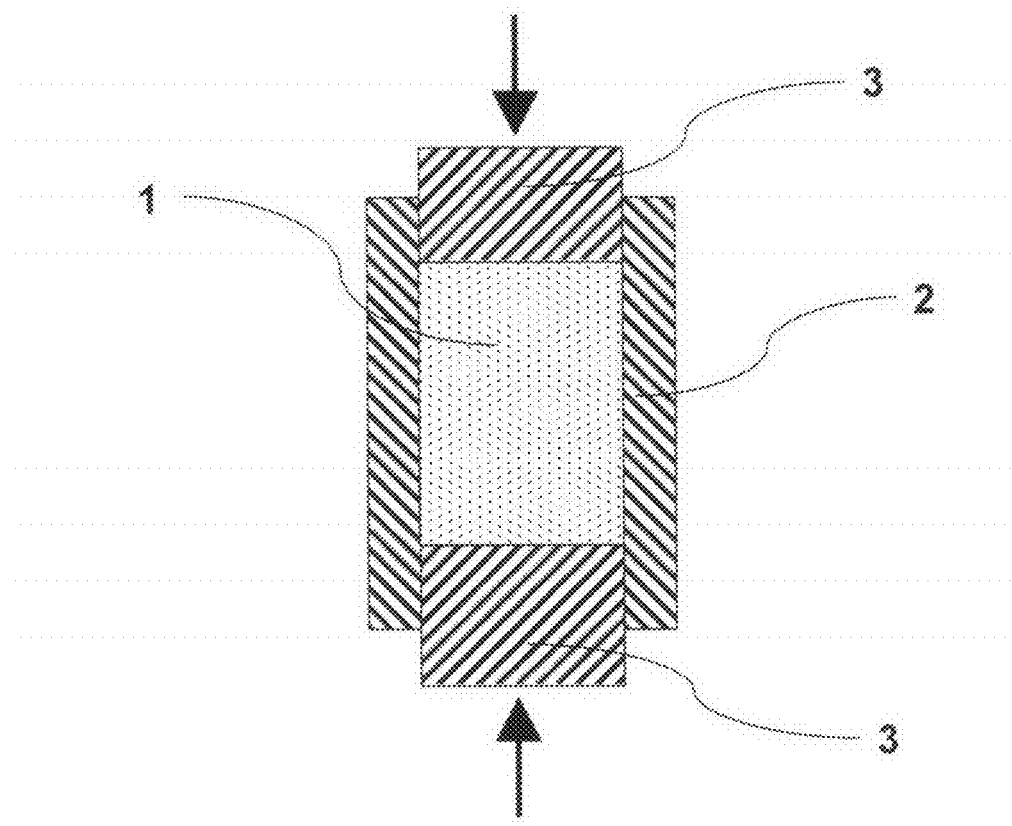
FIG. 1 shows schematically a recipient filled with a powder mixture of solid matrix particles and solid compound particles for compacting the powder mixture, in accordance with the inventive method.

The present invention proposes a material and process that will satisfy the requirements imposed by the use of Sn based alloys containing a dopant of the group Ti, V, Zr or Hf in the fabrication of $Nb_3Sn$ superconductors.

The Sn based alloy processed according to the inventive method has smaller size compound inclusions uniformly distributed in the formed billet and better material yield by avoiding the material losses associated with the shrinking at the surface of an ingot cast in a mold, as compared e.g. to a process as described in [11].

The present invention provides Sn based alloys comprising a metal matrix of Sn or Sn alloy with fine compound inclusions containing one or a combination of the elements in the group of Ti, V, Zr and Hf (further referred to as dopant), and one or a plurality of other elements, in particular Sn, Cu and/or Nb. The metal matrix material is typically Sn or a Sn containing alloy, typically with a Sn content of 50 atomic % or more. Further, the Sn content in the total Sn based alloy is typically 50 atomic % or more. The concentration of the sum of all dopants within the total Sn based alloy is typically of 0.5 to 10 atomic %.

The weight fraction of compound inclusions in the Sn based alloy is typically of 5 to 20%. The material of the compound inclusions ("compound material") typically has a content of between 20 and 80 atomic % of dopants (i.e. Ti, V, Zr and/or Hf summed up), and accordingly a content of between 80 and 20 atomic % of other elements, in particular Sn, Cu and/or Nb.

The matrix material which is pure Sn or a Sn alloy of at least 50 atomic % Sn contains essentially no dopant. If any dopant is present at all in the matrix material, it has a much lower concentration than in the compound material, such that the dopant is completely dissolved in the matrix.

A method is provided for preparing Sn based alloys by mixing and compacting Sn (or Sn alloy) particles with very fine solid compound particles containing one or more dopant elements and one or several other elements, in particular Sn, Cu and/or Nb, to form a solid body of Sn based alloy with uniformly distributed inclusions of said compound. Typically, the particles of the compound material are much finer (smaller) than the particles of the metal matrix material. The compound material can be for example $Ti_2Sn_3$, $Ti_6Sn_5$, $Ti_5Sn_3$, $HfSn_2$, $Hf_5Sn_4$, $V_2Sn_3$, $V_3Sn$, $ZrSn_2$, $Zr_5Sn_3$, $CuTi_3$, $CuTi_2$ and/or $CuZr_2$ prepared in advance as powders with particles having a maximum diameter of typically 10 µm or less, preferably 5 µm or less. Powders with such fine particles can be prepared easily because of the brittle nature of these intermetallic compounds. The particles may be covered with a thin coating of another material to prevent oxidation and/or agglomeration.

The innovation consists in preparing the said Sn based alloy as a metal matrix composite from individual particulate constituents (i.e. matrix and compound inclusions), rather than by the solidification of a homogeneous melt of Sn and dopant(s) as done for the state of the cast alloys as described in [11]. As a further innovation of this method, the dopant carrying compound can be formed with other elements than Sn, such as Cu for example, which is not possible with the current methods of preparing Sn based alloys. For forming the inventive Sn based alloys, the mixed matrix and compound particles do not need to be melted together as it is the case for the state of the art cast alloys. The Sn matrix particles may be liquid for a short time during the process of mixing and compacting but there will be no substantial diffusion between the matrix and the solid compound particles because of the short time they spend at high temperature/liquid state. For this reason, the mixing is purely mechanical rather than chemical. The mixing and compaction results in a dense, compact body with uniformly distributed compound inclusions containing dopant. Whereas a mixture of powders could be used as such in the preparation of $Nb_3Sn$ superconductors in a manner similar with that of preparing powder in tube type $Nb_3Sn$ superconductors (for example see ref. [15]), it is a lot more convenient to use a solid, ductile material rather than free flowing powders.

During the reaction heat treatment at 600-700° C. applied to the internal Sn type $Nb_3Sn$ conductors fabricated with the Sn based alloy of this invention, the dopant will diffuse from the compound inclusions into the Sn matrix (which will be liquid at that stage) and then together with the Sn to the forming $Nb_3Sn$ filaments.

Several approaches are described here for the preparation of the Sn based alloys with the method of this invention, but others can be envisaged to achieve the same objective. In all cases not only the mixing as discussed above, but also the compaction is done predominantly mechanically, either by applying an external pressure or by the momentum and weight of particles, in particular solidifying particles of matrix material, hitting a target.

In a first approach in accordance with the invention, which is preferred for preparing smaller batches of Sn based alloy, the techniques of powder metallurgy are applied, compare FIG. 1.

Sn powders (powders of solid matrix material particles) will be mixed with fine compound powders (powders of solid compound material particles), preferably in a protective atmosphere of nitrogen or argon, by using a conventional blending device like a V-blender, powder tumbler, ball mill or fluidized bed device to achieve a uniform distribution of the compound particles in the Sn powder. The powder mixture 1 will be then inserted in a recipient, with side parts 2 and movable stamps 3, where it can be subjected to mechanical pressure (uniaxial or isostatic) at temperatures below the melting point of the Sn (or Sn alloy) matrix (~232° C. for pure Sn). During a hold of the mechanical pressure at the chosen temperature, the Sn alloy particles constituting the matrix will mechanically deform to eliminate the empty space between them and will sinter to form a dense solid body. The compound inclusions will not deform in the process, nor will they react by substantial diffusion with the matrix because of the relatively low temperature at which the compacting takes place, but they will be well surrounded by and connected to the matrix. Further mechanical deformation by extrusion, swaging and/or rod drawing will be possible, and they will be employed on the solid compacted material to bring the material to the shape/size needed for insertion in precursor sub-elements for the fabrication of $Nb_3Sn$ superconductors. These additional deformation steps may reduce even more the size of the small voids that may be left in the compacted material. The Sn based alloy may be clad with Cu or another metal during the compaction procedure and/or the subsequent deformation steps.

For preparing larger amounts of Sn based alloy with compound inclusions containing dopant by the method of this invention, it is desirable to use a process in which the mixing and compacting are done in a single step that is easily scaleable to industrial manufacturing. According to the invention, a spray forming process can be applied.

Figure 2:
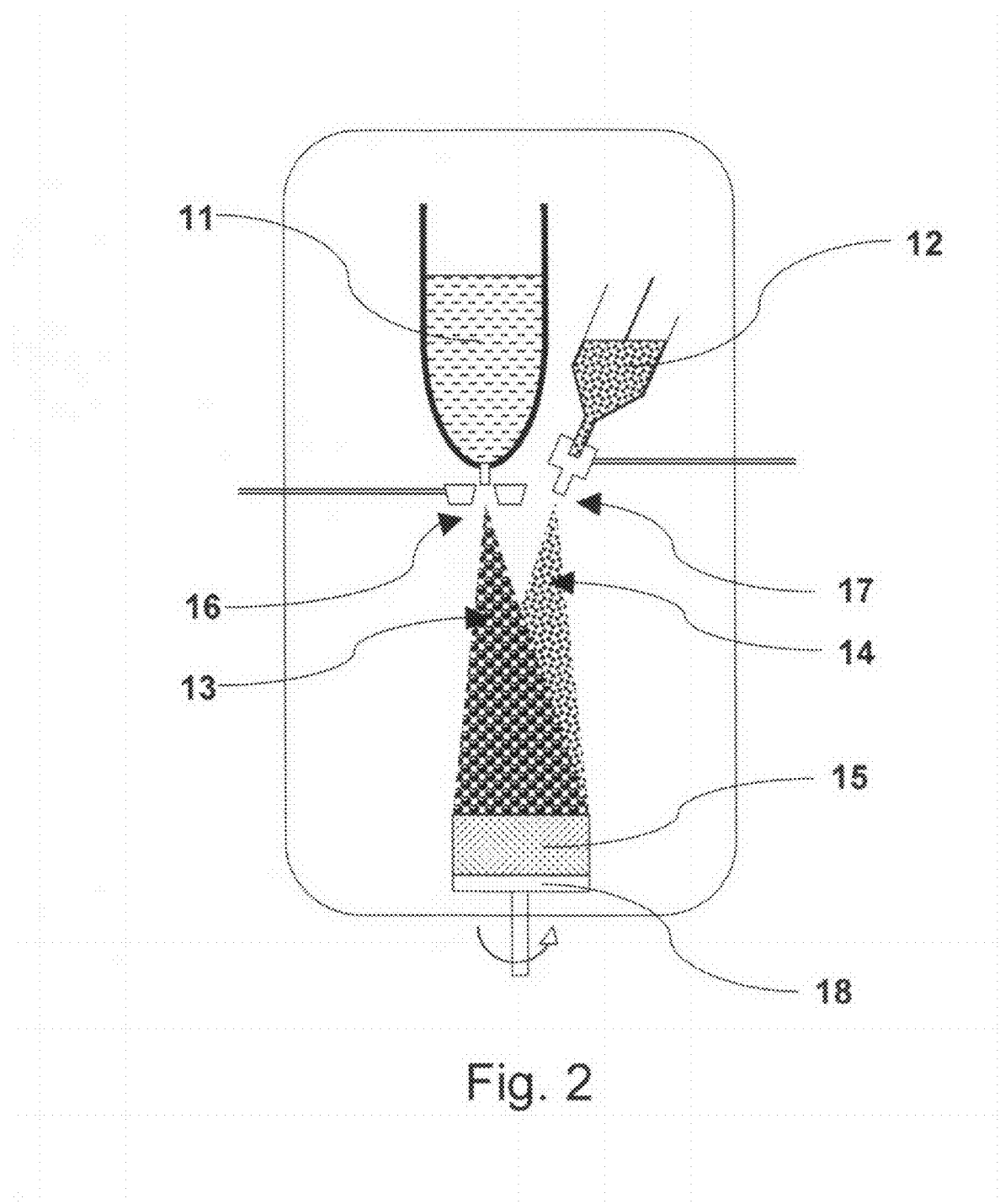
FIG. 2 shows schematically a facility for producing the inventive Sn based alloy by spraying a matrix material melt and a solid compound particle jet onto a target, in accordance with the invention.

More specifically, it is proposed to add the dopant containing compound in solid state as a jet (fluidized bed) of fine particles that will be mixed in the flight with a spray of liquid droplets of metal matrix (Sn or Sn alloy), compare FIG. 2.

To prepare a Sn based alloy according to our invention, the metal matrix material is first melted and heated to a temperature of no more than around 600° C. The melt of matrix material 11 is then fed into a gas atomizer 16 that will break the stream of liquid melt into droplets to form a directed spray or jet 13. The same gas atomizer or, as shown in FIG. 2, an independent powder fluidizing device 17 will form a jet 14 of solid compound particles from a storage of solid compound particles 12 in a protective gas carrier. The jet 14 of solid compound particles will mix during its generation and/or during its flight with the jet 13 of metal matrix droplets.

The flow of liquid in the stream to be atomized (i.e. to be broken into a spray) and the flow of compound powder will be controlled to give the correct proportions of metal matrix and compound inclusions. If the particular device for fluidizing powders 17 and controlling their flow is less performing with relatively small amounts of powder, then it can be fed with a mixture of compound powder and metal matrix powder.

The two combined jets 13, 14 are projected towards a cooled rotating table 18 as a target. The cooling may be done with a flow through of room temperature water, for example. As the liquid metal matrix droplets in jet 13 and the compound particles of jet 14 hit their target, the droplets will deform against the target surface and, if the temperature of the liquid was properly chosen, will solidify shortly while trapping in the process the compound particles. By their flow deformation the liquid droplets will fill all available spaces at the surface and form a rather dense Sn based alloy 15 in the form of a cylindrical billet.

Given the low melting point of Sn and of its alloys, it is also possible to use plasma spraying or electrical-arc thermal spraying to generate the spray of liquid matrix metal. In the same device or in an independent device for fluidizing powder, the jet of compound particles is to be generated and then mixed with the jet of matrix metal droplets before deposition on a target in a similar manner with the case of spray forming. As a matter of fact this would be a case of spray forming in which the spray is generated by a different technique rather than gas atomizing a stream of liquid.

A relatively low power plasma spraying gun could be fed with a mixture of solid metal matrix powder and compound powder if the melting point of the compound is high enough not to be melted by the plasma. The melting of the compound powder particles could be accepted if they resolidify before hitting the target. With the plasma power properly adjusted, the mixed spray of liquid matrix metal droplets and compound particles exiting this gun would accumulate on the cooled rotating target as a rather dense deposit of Sn based alloy with compound inclusions.

By using electrical-arc thermal spraying, the same results can be achieved by continuously supplying the matrix metal in the form of e.g. two rods or wires that will be melted by an electrical arc between them and then sprayed by a gas atomizer that could also be carrying the compound particles.

If the mixed jet(s) of any of the above processes of preparing the Sn based alloy have a large divergence, it is possible to direct them towards the interior of a mold, preferably made of Cu and cooled, and deposit the material inside with minimal overspray losses. The losses of material to shape it for further processing will be minimized as well.

The billets obtained by any of the processes presented above will be then deformed using standard metallurgical processes like extrusion and wire drawing to form a rod with a diameter suitable for insertion in a precursor subelement for a rod type internal Sn processed $Nb_3Sn$ wire. It can also be rolled into a sheet or foil for other precursor wires fabricated by techniques where the pure Sn or Sn based alloy is assembled in flat form.

It is also the purpose of this invention to provide methods for using the Sn based alloys of this invention to the fabrication of internal Sn $Nb_3Sn$ superconducting wires. The present invention equally applies to the two variants of the internal Sn process for the fabrication of the $Nb_3Sn$ superconductors: the rod type and the tube type. However, the invention is not restricted to these two types of wires and can be applied to other methods of producing $Nb_3Sn$ superconductors where Sn or Sn based alloy is assembled in the precursor wire, regardless of the shape of the Sn alloy, be it bar, rod, wire, sheet or foil. In all cases the Sn based alloy with fine compound inclusions can be used instead of pure Sn or Sn based alloy with larger precipitates, with the benefit of an improvement in the critical current density and without the negative effects of large precipitate sizes present in conventionally mold cast Sn alloys.

The precursor subelement for rod type internal Sn $Nb_3Sn$ wire will have a multitude of Nb alloy filaments in a Cu matrix, uniformly distributed around a single or multiple central holes in which the Sn alloy rod(s) of this invention will be inserted. The area of the precursor subelement containing Nb filaments may also be surrounded by a continuous layer of Nb, Ta or V alloy, this layer being surrounded by a continuous layer of Cu. The purpose of the Nb, Ta or V alloy layer is to prevent the Sn from diffusing into the external Cu.

This subelement may be fabricated by assembling the constituent materials around a sacrificial material and deforming them to a lower diameter where the sacrificial material in the center is removed by drilling or by dissolving in a properly selected liquid to form a hole or multiple holes for inserting the Sn alloy of this invention. The assembled constituents may also be deformed around a central mandrel to form directly a tube with the hole for the Sn alloy.

Other variants may be envisioned in which the constituent materials Nb and Cu are wrapped around the sacrificial core or the Sn alloy itself. Tube internal Sn type $Nb_3Sn$ wires can also be made with Sn based alloy of this invention. The Sn based alloy rod will be in such a case inserted in a Nb tube with Cu cladding on the interior and exterior surfaces to form the precursor subelement of the wire.

After mechanical deformation by wire drawing, the subelement with Sn alloy core(s) will be shaped and cut in multiple pieces to be stacked in a tube containing at least Cu. The said tube with the subelements inserted in it will be deformed by wire drawing to reduce its diameter to a size suitable for winding coils. A reaction heat treatment at 600 to 700° C. for a properly selected period of time will form the $Nb_3Sn$ superconductor doped with the element(s) present in the Sn based alloy of this invention.

In the following, two preferred embodiments of the invention are discussed in further detail.

Preferred Embodiment Nr. 1

A Sn based alloy will be prepared heating liquid Sn to a temperature around 450-500° C. and then spraying the liquid and a jet of $Ti_2Sn_3$ particles on a cooled rotating target to form a dense ingot of Sn alloy with fine, uniformly distributed compound inclusions. The maximum size of the $Ti_2Sn_3$ particles will be 5 μm or less. The flows of liquid Sn and $Ti_2Sn_3$ powder will be adjusted in a weight ratio of 9.6, as this will lead to a Ti concentration of 5 atomic % Ti with respect the total amount of material prepared. This ratio may need to be adjusted if the jets of liquid Sn and $Ti_2Sn_3$ particles have different losses by overspray (i.e. material does not deposit on the target).

The overall composition chosen for this preferred alloy, namely of 5 atomic % Ti, will lead to a concentration of approximately 1.5 atomic % in the $Nb_3Sn$ filaments at the end of the reaction heat treatment, which in turn leads to the highest critical current densities. As a dopant element for $Nb_3Sn$, Ti is one the most widely used because it diffuses quite fast in Cu and $Nb_3Sn$.

The spray formed ingot will be then deformed using standard metallurgical processes like extrusion and wire drawing to form a rod with a diameter suitable for insertion in a precursor subelement for a rod type internal Sn processed $Nb_3Sn$ wire.

The precursor subelement will be fabricated by assembling Cu clad Nb alloy filaments around a Cu core in an extrusion billet made of Cu. A Nb alloy barrier made of sheet metal will separate the Cu clad Nb filaments from the wall of the Cu billet. The Nb filaments will occupy about 50% of the area in this assembly excluding the exterior Cu. After mechanical deformation by extrusion and drawing to consolidate and reduce the diameter of the assembly, a longitudinal hole will be drilled in the resulted bar. The diameter of the hole will be such that the Sn inserted in it occupies around 25% (preferably more) of the area excluding the exterior Cu. The inserted Sn alloy will not be in direct contact with any of the Nb filaments.

After wire drawing to a smaller size, the subelement material with Sn alloy core will be shaped hexagonally and cut in a number of pieces (127 or 217 for example) of equal lengths to be assembled in a Cu tube with specially shaped interior. Because of the small and finely distributed compound inclusions, the subelements can reach small sizes without distortion caused by the Sn—Ti compound inclusions in the Sn alloy. The dimensions of the Cu tube will be chosen such that the in the assembled wire about 50% of the area is occupied by Cu, excluding the Cu inside the Nb alloy barrier. The assembly will be drawn to a final diameter in the range of 0.5 to 2 mm. A suitably selected heat treatment at temperatures in the range of 600 to 700° C. will be applied to form the $Nb_3Sn$ doped with Ti and high critical current density. In the reacted subelements the Nb alloy barrier layer at the periphery will be left partially unreacted to prevent the Sn from diffusing the in the Cu separating the subelements.

Preferred Embodiment Nr. 2

A rod of Sn alloy with an overall concentration of 5 atomic % Ti (present in the form of $Ti_2Sn_3$) will be prepared as described for the preferred embodiment nr. 1, this will be used for the fabrication of a tube type internal Sn $Nb_3Sn$ wire. The Sn—Ti alloy rod will be inserted in an assembly of concentric layers of Cu, Nb alloy and Cu. The size of central hole will be chosen such that the Sn—Ti alloy inserted in it occupies about 35% of the Nb alloy area. The area of the Cu layer separating the Sn—Ti alloy from the Nb alloy will be such that in the center of the Nb tube there is 40 atomic % Cu with respect to the sum of Cu and Sn.

Following Sn alloy insertion, the precursor subelement will be reduced by wire drawing to a smaller size, shaped hexagonally and cut in a number of pieces (127 or 217 for example) of equal lengths to be assembled in a Cu tube with specially shaped interior. Because of the small and finely distributed compound inclusions, the subelements can reach small sizes without distortion caused by the Sn—Ti compound inclusions in the Sn alloy. The dimensions of the Cu tube will be chosen such that in the assembled wire about 50% of the area is occupied by Cu, excluding the Cu inside the Nb alloy barrier. The assembly will be drawn to a final diameter in the range of 0.5 to 2 mm. A suitably selected heat treatment at temperatures in the range of 600 to 700° C. will be applied to form the $Nb_3Sn$ doped with Ti and high critical current density. In the reacted subelements a layer of Nb at the periphery will be left unreacted to prevent the Sn from diffusing in the Cu separating the subelements.

In summary, the present invention proposes to manufacture a Sn based alloy by separately providing liquid or solid particles of a matrix material containing Sn, and liquid or solid particles of a compound material containing one or a plurality of dopant elements. The compound particles have a size as desired in the final Sn based alloy, which is used for manufacturing a $Nb_3Sn$ superconducting wire. The separately provided matrix and compound particles are brought together, mechanically mixed and mechanically compacted. The compaction results in a density of the resulting Sn based alloy typically 50% of the theoretical density or more, and leads to a coherent body. The resulting Sn based alloy contains the (if formerly liquid now solidified) matrix and compound particles as grains in its structure; originally separate particles exhibit grain boundaries and phase interfaces in the touching areas to other particles. The method is performed without grain growth of the compound particles during mixing and compacting, in particular by keeping the temperature in the agglomerate of mixed particles low enough. The Sn based alloy can be used to form $Nb_3Sn$ with neighboring Nb material when a suitable heat treatment is applied, with the dopant contained in the compound inclusions diffusing into the formed $Nb_3Sn$ material, where it increases the current carrying capacity in the superconducting state.

REFERENCES

[1] M. Suenaga, D. O. Welch, R. L. Sabatini, O. F. Kammerer, and S. Okuda, "Superconducting critical temperatures, critical magnetic fields, lattice parameters, and chemical compositions of "bulk" pure and alloyed $Nb_3Sn$ produced by the bronze process," *J. Appl. Phys.*, vol. 59, pp. 840-853, 1986.
[2] K. Tachikawa, T. Asano, and T. Takeuchi, "Method for producing $Nb_3Sn$ superconductors," U.S. Pat. No. 4,385,942, May 31, 1983.
[3] K. Tachikawa, H. Sekine, and S. Miyashita, "Process for producing Ti-containing $Nb_3Sn$ composite superconductor," U.S. Pat. No. 4,767,470, Aug. 30, 1988.
[4] S. Murase, H. Shiraki, E. Suzuki, M. Ichihara, Y. Kamisada, N. Aoki, and T. Kumano, "Method of fabricating multifilament superconductors," U.S. Pat. No. 4,776,899, Oct. 11, 1988.
[5] K. Tachikawa, K. Togano, and T. Takeuchi, "Method for producing $Nb_3Sn$ superconductors," U.S. Pat. No. 4,341,572, Jul. 27, 1982.
[6] K. Tachikawa, H. Sekine, K. Itoh, and Y. Iijima, "Process for producing $Nb_3Sn$ superconductor," U.S. Pat. No. 4,419,145, Dec. 6, 1983.
[7] N. Sadakata, Y. Ikeno, M. Sugimoto, and O. Kohno, "Method for fabricationg superconductive electrical conductor," U.S. Pat. No. 4,665,611, May 19, 1987.
[8] K. Tachikawa and Y. Yoshida, "Process for producing $Nb_3Sn$ superconducting wires," U.S. Pat. No. 4,435,228, Mar. 6, 1984.
[9] Y. Kubo, "Method for producing Nb—Sn compound superconducting wire precursor and wire," U.S. Pat. No. 6,436,554 B2, Aug. 20, 2002.
[10] S. Hong, J. Parrell, and M. Field, "Method for producing $(Nb,Ti)_3Sn$ wire by the use of Ti source rods," U.S. Pat. No. 6,981,309 B2, Jan. 3, 2006.
[11] T. Nagai, Y. Kubo, K. Egawa, and O. Taguchi, "Sn based alloy containing Sn—Ti compound, and precursor of $Nb_3Sn$ superconducting wire," U.S. Pat. No. 6,548,187 B2, Apr. 15, 2003.
[12] E. Gregory, B. A. Zeitlin, M. Tomsic, T. Pyon, M. D. Sumption, E. W. Collings, E. Barzi, D. R. Dietderich, R. M. Scanlan, A. A. Polyanskii, and P. J. Lee, "Attempts to reduce ac losses in high current density internal-tin $Nb_3Sn$," Adv. Cryo. Eng., vol. 50, pp. 789-796, 2004.
[13] R. G. Brooks, "Manufacture of metal articles," United Kingdom Patent 1,379,261, Jan. 2, 1975.
[14] R. G. Brooks, "Method for making shaped articles from sprayed molten metal," United Kingdom Patent 1,472,939, May 11, 1977.
[15] T. Miyazaki, H. Kato, K. Zaitsu, and K. Tachikawa, "Method for producing $Nb_3Sn$ superconductive material using powder process," U.S. Pat. No. 7,459,031 B2, Dec. 2, 2008.
[16] Q. Li, B. Hu, C. M. Choy, S. Zhang, "Method of forming articles from alloys of tin and/or titanium", United States of America laid open patent application 2005/0163646 A1, Jul. 28, 2005.

I claim:
1. A method for producing a Sn based alloy, the method comprising the steps of:
  a) selecting a metal matrix material comprising Sn;
  b) selecting a compound material of solid compound particles for inclusion into the metal matrix material as a dopant, thereby forming compound inclusions, the compound material being composed of one or more elements, one of these elements being selected from the group consisting of Ti, V, Hf and Zr;
  c) liquefying the metal matrix material;
  d) spraying the liquefied metal matrix material in a directed jet of matrix material droplets onto a target; and
  e) spraying, during step d), a directed jet of the solid compound particles onto the target, thereby effecting a mixing of matrix particles derived from the droplets of liquid metal matrix material with the solid compound particles, wherein fractions of all elements in the compound material and relative mass flows of the jet of matrix material droplets and the jet of solid compound particles are chosen such that a resulting Sn based alloy has a total content of 0.5 to 10 atomic % of the element selected from the group consisting of Ti, V, Hf and Zr.
2. The method of claim 1, wherein one or more other elements in the compound material are selected from the group consisting of Sn, Cu and Nb.
3. The method of claim 1, wherein, in step c), the metal matrix material is melted and heated to a temperature of not more than 600° C.
4. The method of claim 1, wherein the target is a rotating table.
5. The method of claim 1, wherein the target is cooled.

6. The method of claim 1, wherein the matrix particles have a maximum diameter of 200 μm or of 100 μm.

7. The method of claim 1, wherein the compound particles have a maximum diameter of 10 μm or of 5 μm.

8. The method of claim 1, wherein the compound inclusions have a diameter of 10 μm or less or of 5 μm or less.

9. The method of claim 1, wherein the metal matrix material further comprises 0.1 to 20 atomic % of Cu.

10. The method of claim 1, wherein the metal matrix material further comprises 0 to 5 atomic % of elements which are not selected from the group consisting of Sn, Ti, V, Hf, Zr, Cu and Nb.

* * * * *